United States Patent [19]

Oettinger et al.

[11] Patent Number: 4,460,831
[45] Date of Patent: Jul. 17, 1984

[54] LASER STIMULATED HIGH CURRENT DENSITY PHOTOELECTRON GENERATOR AND METHOD OF MANUFACTURE

[75] Inventors: Peter E. Oettinger, Acton; Chunghsin Lee, Reading, both of Mass.

[73] Assignee: Thermo Electron Corporation, Waltham, Mass.

[21] Appl. No.: 525,514

[22] Filed: Aug. 22, 1983

Related U.S. Application Data

[63] Continuation-in-part of Ser. No. 325,960, Nov. 30, 1981, abandoned.

[51] Int. Cl.³ .................. G21K 5/04; H01J 40/06; H01J 40/16
[52] U.S. Cl. .................. 250/492.2; 313/542
[58] Field of Search .................. 313/542, 544; 29/572; 250/492.2, 542

[56] References Cited

U.S. PATENT DOCUMENTS

| | | | |
|---|---|---|---|
| 3,408,521 | 10/1968 | Bore et al. | 313/94 |
| 3,575,628 | 4/1971 | Word | 313/94 X |
| 3,585,433 | 6/1971 | O'Keefe et al. | 313/94 |
| 3,814,964 | 6/1974 | Ace | 313/544 X |
| 4,039,810 | 8/1977 | Heritage | 250/396 |
| 4,097,761 | 6/1978 | Ruedy et al. | 313/94 |
| 4,115,223 | 9/1978 | Thrush | 204/129 |
| 4,213,053 | 7/1980 | Pfeiffer et al. | 250/492 |
| 4,227,090 | 10/1980 | Amboss et al. | 250/492 |
| 4,286,373 | 9/1981 | Gutierrez et al. | 29/572 |

FOREIGN PATENT DOCUMENTS

| | | |
|---|---|---|
| 966442 | 8/1964 | United Kingdom. |
| 1336626 | 11/1973 | United Kingdom. |
| 1467521 | 3/1977 | United Kingdom. |

OTHER PUBLICATIONS

AR. R. K. Watts and J. H. Bruning, "A Review of Fine-Line Lithographic Techniques: Present and Future", *Solid State Technology*, May 1981, pp. 99-105.
AS. T. H. P. Chang et al, "Electron-Beam Lighography Draws a Finer Line", *Electronics*, May 12, 1977, pp. 89-98.
AT. J. C. Edison et al, "A Precision High-Speed Electron Beam Lithography System"; J. Kelly et al, "a Precision, High-Current, High-Speed Electron Beam Lithography Column"; and E. A. Lindbert et al, "A Precision X-Y Stage and Substrate Handling System for Electron Beam Lithography", *Hewlett-Packard Journal*, May 1981, pp. 1-20.
AR". C. K. Sinclair et al, "A High Intensity Polarized Electron Source for the Stanford Linear Accelerator", *High Energy Physics with Polarized Beams and Targets A.I.P. Conference Proceedings No. 35*, 1976.
AS'. C. K. Sinclair, "High Intensity Polarized Electron Sources", *Nuclear Instrumentation*, 1980.

*Primary Examiner*—Alfred E. Smith
*Assistant Examiner*—Jack I. Berman
*Attorney, Agent, or Firm*—Herbert E. Messenger

[57] ABSTRACT

An electron beam generator particularly adapted for direct-write semiconductor lithography applications is disclosed which includes a photoemissive cathode, a modulable laser for illuminating the photoemissive cathode, and light optics to create an optical pattern on the cathode. The photoemissive cathode is composed of a light transmissive substrate onto which is deposited an optically semitransparent, electrically conductive film. This film in turn is coated with a thin layer of a photoemissive substance such as cesium antimonide so that the photoemissive cathode emits an intense and substantially monochromatic beam of electrons upon laser light illumination. The emitted electron beam is configured in accordance with the optical pattern created on the cathode, and in passing through successive electron optical devices is further shaped and sized for use, for example, in lithographically generating very large scale integrated (VLSI) circuits on semiconductors.

22 Claims, 8 Drawing Figures

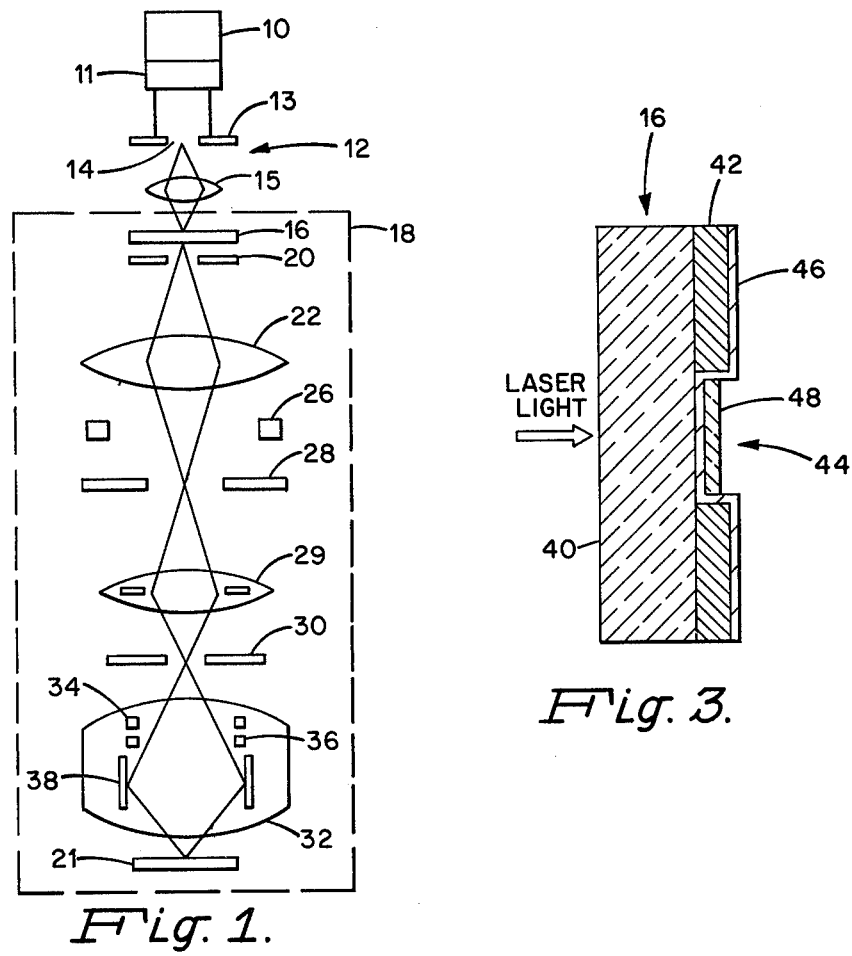
Fig. 1.
Fig. 3.
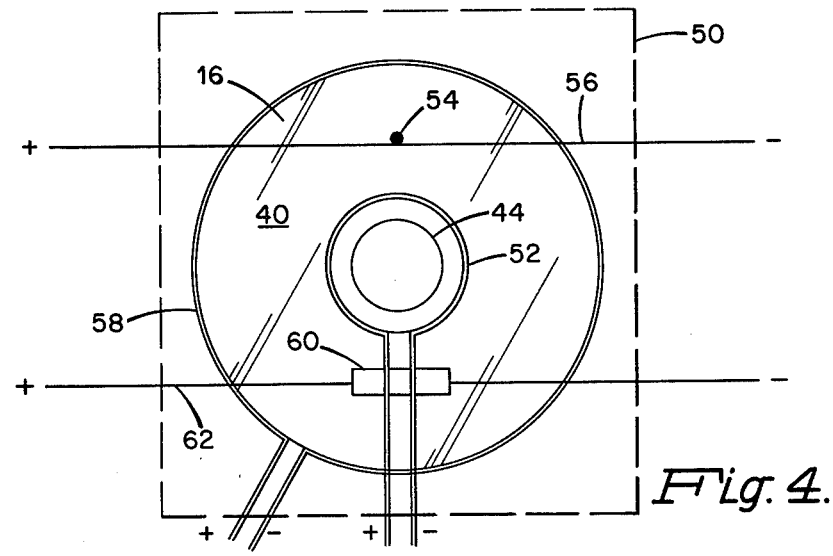
Fig. 4.

LASER STIMULATED HIGH CURRENT DENSITY PHOTOELECTRON GENERATOR AND METHOD OF MANUFACTURE

CROSS REFERENCE TO RELATED APPLICATION

This is a Continuation-in-Part of U.S. Application Ser. No. 325,960, filed Nov. 30, 1981, now abandoned.

BACKGROUND OF THE INVENTION

This invention relates to photoemissive electron beam generators which emit high current density beams of electrons upon illumination by an appropriate laser or light-emitting diode, and which are particularly suitable as electron sources for electron beam semiconductor lithography.

As more and more elements are placed on semiconducting chips, lithography systems having ever greater resolution must be developed in order to generate the increased number of elements on the chips. Optical lithographic systems operating at visible wavelengths have resolution limits approximating 1.25 micrometers. Electron beams have been proposed and successfully used to reduce feature size below this limit. Such systems can have resolutions well below 1 micrometer because of the shorter wavelengths associated with high energy electrons.

Since modern lithographic systems must achieve fast writing times (high throughput rates) in addition to high resolution, their electron beams must also have a high brightness, which in the case of electron beams requires a high current density. This property is particularly important for so called direct-write applications wherein the electron beam is rapidly steered and modulated so as to effect a projection of the highly complex circuit pattern directly onto a semiconducting chip. Direct-write methods contrast with conventional projection lithographic techniques in which a mask element is used to define the entire pattern for simultaneous exposure of all features onto the chip.

Bright electron sources presently used in lithography are, for example, tungsten and $LaB_6$ thermionic cathodes, barium dispenser cathodes, and heated W/O/Zr field emitters. Such field emitters have attained a nominal brightness value of $5 \times 10^7$ A/cm$^2$/sr (amperes/-square centimeter/steradian).

Each of these electron sources has, however, some unfavorable characteristics. The tungsten filament suffers from high evaporation rate at operating temperature. $LaB_6$ is difficult to bond to appropriate substrates, is easily poisoned by environmental impurities, tends to decompose or evaporate at operating temperatures, and forms undesirable current intensity lobes. Dispenser cathodes tend to evaporate at operating temperatures and are, moreover, easily poisoned. Furthermore, the support systems of heated cathodes are subject to high temperature distortions. Such distortions are likely to cause configurational changes in the electron beams. Finally, field emitters are also easily poisoned, may suffer from spot migration of flicker, require frequent reprocessing and, if heated, may introduce beam errors through geometrical distortions caused by the hot support system. Hot emitters are further limited by the finite time required to heat them, thereby precluding rapid intensity modulation of such electron sources by varying the temperature. For lithographic systems with heated emitters, beam modulation at the target plane is produced electrostatically and requires the additional complexity of blanking electrodes located in the lithographic column.

Cold electron emitters are known such as environmentally stable cesium iodide and palladium photocathodes. These photocathodes, however, are not sensitive to visible light and therefore require an ultraviolet light source to provide electrons for lithography columns operating at lower vacuum conditions in the range of $10^{-4}$ to $10^{-5}$ torr. The low brightness (approximately 10–50 A/cm$^2$/sr) of these cathodes has restricted their use to projection lithography.

Another criterion for high resolution lithography is that the electron source have uniform and substantially monochromatic (low spread in electron energy) emission. Low spread in electron energy is necessary to provide high resolution imaging by allowing the electron beam to be focussable to a minimum sized spot.

It is an object of this invention, therefore, to provide an electron beam generator which produces a high current density beam of electrons from a photoemissive source operated at low temperatures.

An object of this invention is to provide such an electron source in which the electrons in the generated electron beam are substantially monochromatic (monoenergetic), thus permitting high resolution imaging by allowing the electron beam to be focussable to a minimum sized spot.

A further object of this invention is to provide a photoemissive cathode whose spectral response is compatible with existing optically monochromatic visible light continuous wave (CW) lasers.

Another object of this invention is to provide a photoemissive cathode capable of producing a high current density beam of electrons in continuous-mode operation when illuminated with an optically monochromatic injection laser emitting radiation in the near-infrared region or with a suitably intense light-emitting diode (LED).

Yet another object of this invention is to provide a photoemissive surface which is easy to both prepare and restore.

Another object of the invention is to provide a device suitable as a lithographic electron source which creates an electron beam whose intensity may be modulated by modulating the activating laser beam, thereby providing beam blanking and reducing proximity effects.

Another object of the invention is to provide a device suitable as a lithographic electron source which creates an electron beam whose intensity may be modulated by modulating the current input to the laser.

Another object of the invention is to provide an electron source whose emitted beam is spatially uniform and is shapable by shaping the optical illuminating beam.

SUMMARY OF THE INVENTION

According to the present invention there is provided a photoemissive cathode operable to emit a high current density beam of electrons upon illumination with appropriate laser energy, and an electron beam generator which includes the photoemissive cathode and which is suitable for a semiconductor lithography system. The electron beam generator comprises, in addition to the photoemissive cathode, a continuous wave laser or light-emitting diode (LED), a modulator for deflecting or varying the intensity of the output beam of the laser or LED at a modulation rate of at least several megahertz, and a light optical train for creating a pattern with the output beam on the cathode such that the cathode emits an electron beam suitable for lithography.

In a preferred embodiment the photoemissive cathode for generating the electron beam upon illumination by laser light includes a substrate which is optically transmissive at the lasing wavelength, an optically semi-transparent (at the lasing wavelength), electrically conductive film deposited on the substrate, and a photoemissive surface film deposited on the electrically conductive film. The photoemissive cathode is operated within a high vacuum environment and preferably in thermal contact with a thermoelectric cooler or other cooling device. The photoemissive surface film is oriented such that the surface will emit electrons upon back illumination by laser light. Although the back-illuminable cathode is preferred for lithographic applications, a front-illuminable cathode formed by deposition of a photoemissive surface film onto an opaque, electrically conductive substrate is an alternative configuration for applications where a non-obstructed path can be provided for the laser light.

A preferred embodiment of the invention includes an argon ion continuous wave laser operable at a discrete wavelength between 454.5 and 514.5 nanometers. A suitable substrate for the photoemissive cathode is made of quartz, glass, or sapphire. The semitransparent electrically conductive layer is formed by depositing a film of an electrically conductive material such as chromium or nickel or a mixture of these elements onto the substrate. Other suitable electrically conductive materials are tungsten and aluminum. A preferred photoemissive surface film is cesium antimonide ($Cs_3Sb$), formed by consecutive depositions of antimony and cesium. Other suitable photoemissive surface films for the cathode may be formed of sodium potassium antimonide ($Na_2KSb$), or of single crystal compounds coated with cesium or cesium and oxygen, the compounds composed of two or more of the following elements: gallium, phosphorus, and arsenic.

A preferred method of making a $Cs_3Sb$ photoemissive cathode according to the invention includes the formation of electrical connections to the cathode by the deposition onto the transparent substrate of a thick electrically conductive coating of, for example, chromium and nickel. The coating covers the substrate surface except for a portion thereof such as a small central region which is masked prior to deposition to exclude chromium and nickel. This region will subsequently contain the photoemissive surface. The mask is removed after deposition of the thick layer of chromium and nickel, and a thinner coating of chromium and nickel, semitransparent to the illuminating laser wavelength, is deposited over the entire substrate surface. A thin layer of antimony is then vapor-deposited onto the coating of chromium and nickel, and cesium is vapor-deposited onto the antimony to complete the manufacture of the $Cs_3Sb$ photoemissive cathode.

According to another preferred embodiment of the invention, a gallium aluminum arsenide ($(GaAl)As$) near-infrared injection laser or a suitably intense light-emitting diode composed of, for example, GaAs or GaP, is provided for continuous-mode operation in combination with a photoemissive surface containing gallium arsenide coated with cesium or cesium and oxygen ($GaAs(Cs,O)$). The photoemissive surface is applied to a radiation transmissive substrate placed near an output facet of the laser or LED, or to the output facet of the laser or LED, or to the end of an optical fiber whose opposite end receives the output of the laser or LED. No optical train is required for these embodiments, and modulation of the beam of electrons may be accomplished by modulating current input to the injection laser or LED.

BRIEF DESCRIPTION OF THE DRAWINGS

The invention disclosed herein will be better understood with reference to the following drawings in which:

FIG. 1 is a schematic representation of the essential components of an electron beam lithography system employing the photoemissive cathode disclosed herein;

FIG. 3 is a cross-sectional side view of a photoemissive cathode disclosed herein;

FIG. 4 illustrates a method of fabricating the photoemissive cathode of FIG. 3 for lithographic applications;

DESCRIPTION OF THE PREFERRED EMBODIMENTS

Figure 2:
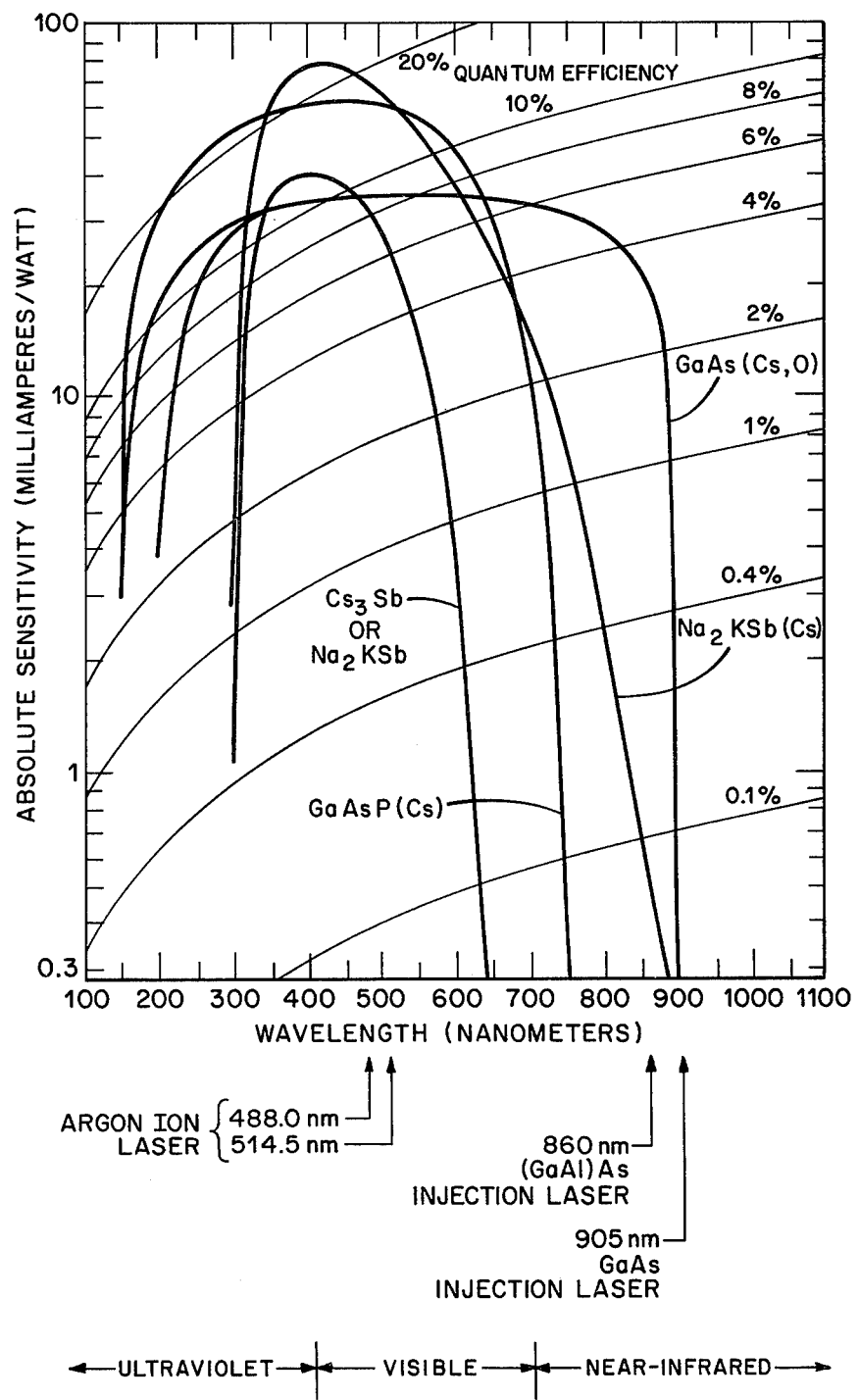
FIG. 2 is a graph illustrating the spectral response of various photoemissive materials sensitive to visible and near infrared radiation as a function of the irradiating wavelength, with appropriate stimulating laser wavelengths indicated.

FIG. 1 is a schematic representation of an electron beam lithography system employing a back-illuminable, laser-irradiable photoemissive electron source according to a preferred embodiment of the invention. The system includes a laser 10 such as an argon ion laser, which is operable to generate a beam of coherent light at one of several radiating frequencies of 454.5, 457.9, 465.8, 472.7, 476.5, 488.0, 496.5, 501.7, and 514.5 nanometers. The strongest radiating frequencies are 488.0 and 514.5 nanometers. A suitable laser is a series 550 argon ion laser available from Control Laser Corporation of Orlando, Fla.

Positioned in the lasing cavity of the laser 10 or at another location near the laser is a beam modulator 11. The modulator 11 may be any electro-optical or acousto-optical device suitable for regulating the intensity of the beam or deflecting it. Such devices are well known and are commercially available as units having a modulation rate of at least several megahertz, a rate essential for achieving fast writing times (high throughput) in direct-write lithography applications.

Acousto-optical modulators, for example, may comprise tellurium dioxide or lead molybdate crystals having a high contrast ratio and rapid rise time (10–20 nanoseconds) and which deflect the laser beam by interaction of the beam with acoustic waves produced in the crystals. An advantage of such devices over other modulators is their relatively low operating voltage and power consumption. One acousto-optical modulator suitable for use with the present invention is a Lead Molybdate Modulator Model 1250C, available from Isomet of Springfield, Va.

Electro-optical modulators include electro-optical materials such as potassium dihydrogen phosphate (KDP) or ammonium dihydrogen phosphate (ADP) which generate birefringence when an electrical field is applied to the material. The birefringence produces a change in polarization of a beam passing through the electro-optical material, and external polarizers included in the modulator then pass a beam whose intensity varies with the applied voltage. An electro-optical modulator suitable for use with the present invention is a low voltage modulator Model 3030 available from Lasermetrics, Inc. of Teaneck, N.J.

The light beam radiating from the laser 10 is guided by a light optical train 12 including a plate 13 having an aperture 14 of specified geometry, for example, a square. A lens 15 focuses the laser light as an image of the aperture 14 onto a photoemissive cathode 16 which will be described in detail hereinafter. The photoemissive cathode 16 and electron optical components for processing the electrons emitted by the cathode 16 are housed within a vacuum chamber schematically illustrated by the dotted enclosure 18. A high vacuum such as a pressure of $10^{-9}$ torr or less is maintained in the vacuum chamber 18.

On the opposite side of the photoemissive cathode 16 from the laser 10 is an anode 20 which operates to accelerate electrons emitted by the cathode 16. An additional negatively charged Wehnelt electrode (not shown) may be positioned between the photoemissive cathode 16 and the anode 20. From the anode 20 the electron beam next passes through various known electron optical components, which shape and position the electron beam as it is directed towards a target 21. After being accelerated by the anode 20, the electron beam passes through an electron lens 22 and then through an electrostatic beam-shaped deflector 26 and a beam-shaping aperture 28. The beam-shaping deflector 26 operates to alter the position of the electron image of the photoemissive electron source on the beam-shaping aperture 28 to create a variably shaped and sized electron beam. The beam next passes through a demagnification lens 29, and subsequently through a beam-limiting aperture 30. Immersed in a final projection lens 32 are dynamic focussing coils 34 which focus the beam onto the target 21, dynamic stigmators 36 which provide astigmatic correction to the beam, and a deflection yoke 38 which scans the beam over the target.

Because the photoemissive cathode 16 responds instantaneously to illumination by the laser 10, the electron beam intensity can be modulated by modulating the laser beam intensity. Modulation of this optical beam is facilitated by location of the beam modulator 11 outside of the high vacuum chamber 18. In prior art lithographic electron beam devices, beam modulation is accomplished by special blanking electrodes which must be located between an electron source and a target within a vacuum enclosure. The lithography system of the present invention takes advantage of the general proposition that replacing any component located in the vacuum enclosure by a similar functional element positioned outside the vacuum enclosure simplifies the overall lithographic column fabrication and operation.

As will be described in greater detail below, the photoemissive cathode 16 includes a photoemissive surface formed, for example, of cesium antimonide, $Cs_3Sb$, which emits electrons when illuminated by the argon ion laser light. FIG. 2 is a graph of the spectral response (milliamperes of electron current per watt of illuminating radiation) of various photoemissive materials as a function of the wavelength of illumination. Note that at the strongest argon ion laser illuminating wavelengths of 488.0 and 514.5 nanometers, cesium antimonide has high sensitivities with quantum efficiencies of 6 percent or more. The combination of strong monochromatic optical emission from the argon ion laser and the good match of the argon ion laser wavelengths to the spectral response of cesium antimonide result in the high current density emission from this photocathode. Other lasers operating at wavelengths below approximately 520 nanometers would also be suited for this photocathode.

Another suitable photoemissive surface for the cathode 16 is the "bialkali" sodium potassium antimonide ($Na_2KSb$) photocathode. Although this surface is more difficult to fabricate than $Cs_3Sb$ because a well-defined ratio of sodium to potassium is required, the cathode is more stable because it does not contain the volatile cesium. The preferred method of making the $Na_2KSb$ photocathode is basically similar to that to be described hereinafter for $Cs_3Sb$, and the spectral response of these two surfaces is similar as is indicated in FIG. 2. Consequently, the $Na_2KSb$ photocathode is also sensitive to argon ion laser irradiation.

Other suitable photoemissive surfaces may be formed from single crystals composed of elements from groups III and V of the Periodic Table such as gallium, phosphorus, and arsenic coated with either cesium or cesium and oxygen. Such surfaces can be made to have a negative electron affinity and therefore substantially increased electron escape depths. This characteristic results in an emission of electrons with especially low energy spread. The easiest of these compounds to fabricate into photoemissive surfaces for lithographic applications are gallium phosphide (GaP), or gallium arsenide phosphide ($Ga(As_xP_{1-x})$), which require only cesium (instead of cesium and oxygen) for activation. In one manner of fabricating these surfaces, a single crystal transmissive layer of GaP is first grown on a substrate optically transparent to the irradiating laser. The GaP is then activated with cesium. Another suitable photoemissive surface is gallium arsenide coated with cesium and oxygen (GaAs(Cs,O)). An argon ion laser, an appropriate semiconductor injection laser, or a suitably intense LED can be used to stimulate electron emission. The argon ion laser emits light at a wavelength near the optimum quantum efficiency for photoemissive surfaces of gallium phosphide, gallium arsenide, and gallium arsenide phosphide, thereby maximizing the emission of electrons.

An injection laser such as a gallium aluminum arsenide ((GaAl)As) infrared injection laser used in combination with a GaAs(Cs,O) photoemissive surface will emit radiation at much lower power levels but can be constructed to operate near the long wavelength threshold of these photoemissive materials, e.g. at about 900 nanometers, thereby minimizing the emitted electron energy spread. In addition, since injection lasers are typically current-driven devices, modulation of their output beam may be achieved by modulating the current input to the injection laser rather than by means of a separate electro-optical or acousto-optical device. For example, a gallium aluminum arsenide injection laser suitable for use in the present invention is a CW injection laser Model No. C86030E available from RCA of Lancaster, Pa., which is modulated by a variable current input.

Light-emitting diodes (LED's) have properties similar to injection lasers but their output is less monochromatic, resulting in a somewhat larger energy spread of the emitted electrons.

The above-described superior characteristics of a system utilizing cathodes having photoemissive surfaces composed of compounds from elements of groups III and V are, however, balanced by the increased difficulty in fabricating such surfaces for use in the transmissive mode. Furthermore, injection lasers are presently limited to power levels under one watt, in contrast to argon ion lasers which can emit six watts or more.

The back-illuminable photoemissive cathode disclosed herein and a preferred method of fabricating the cathode will now be described with reference to FIGS. 3 and 4. With reference first to FIG. 3, the photoemissive cathode 16 includes a light transmissive substrate 40 which is preferably quartz or sapphire but which also may be glass. As will be discussed more completely with reference to FIG. 4, a thick metallic coating 42 is deposited onto one side of the substrate 40. Suitable materials are, for example, chromium, tungsten, aluminum, nickel, and mixtures of these metals. As can be seen in these figures, the layer 42 does not extend into a central region 44, a structure achieved by keeping the region 44 masked during deposition of the coating 42. A thin semitransparent electrically conducting layer 46 of, for example, chromium and nickel is next deposited on top of the layer 42 and the region 44. (This electrically conducting layer may not be necessary for cathodes which utilize gallium phosphide, gallium arsenide phosphide or gallium arsenide as photoemissive surfaces.) Finally, a layer 48 of the photoemissive material, such as cesium antimonide, is produced within the region 44.

The fabrication of a cathode 16 will now be discussed with reference to FIG. 4. First, a suitable transparent substrate 40 such as quartz, sapphire or glass is selected and heated to about 300° C. by means of a nichrome heater wire 58 wrapped around the periphery of the substrate 40. Onto one selected side of the substrate 40 is deposited in vacuum a coating 42 of, for example, chromium or chromium and nickel, sufficiently thick (e.g., about 2000 angstroms) to allow the attachment of external electrical leads and to act as a low resistance electrical path to the central region 44. The thick coating 42 has the function of readily conducting electrons from an external power source to the central region 44, and it also conducts heat away from the central region 44. Deposition of the thick coating 42 may be performed by evaporating chromium and nickel from a resistance-heated nichrome wire 52. The central region 44, which may have an area of approximately 0.02 square millimeters or more (or may have a smaller area to facilitate production of electron beams with very high current densities) is masked to prevent the thick layer of chromium and nickel from being deposited in the region 44. Thereafter the mask is removed and the substrate 40 with the thick coating 42 is heated to about 500° C. to remove surface contaminants. This heating step has been found to improve the adherence of the coating 42 to the substrate 40. Then the temperature is reduced to about 300° C. and a thin electrically conductive, optically semitransparent layer 46 of chromium and nickel is deposited in vacuum on the entire selected substrate side including the previously masked central region 44. This chromium and nickel may also be supplied by the nichrome wire 52, resistance heated to evaporate these elements onto the substrate 40. The nichrome wire 52 is heated until the electrically conductive, optically semitransparent chromium and nickel layer 46 is deposited in the region 44. A suitable thickness for this thin layer 46 of chromium and nickel is about 100 angstroms or less; such a layer 46 will reduce the transmission of visible light through the central region 44 to, for example, between 40 and 50% of that passing through the transparent substrate 40. The thin layer 46 serves as an electrical path between the thick annular coating 42 and the central region 44. Next, the temperature of the substrate 40 with the thick coating 42 and the thin coating 46 is reduced to about 130° C. and an antimony bead 54 melted onto a nichrome supporting wire 56 is resistance heated in vacuum so as to evaporate a thin layer of antimony onto the portion of the layer 46 in the region 44. Evaporation of antimony onto the part of the chromium and nickel layer 46 outside of the central region 44 will not affect the photoemissive behavior of the system. The thickness of the antimony film should be such as to reduce the overall transmission of visible light in the central region 44 to, for example, about 30 to 40% of that passing through the transparent substrate 40. Next the substrate 40 with the chromium and nickel coating and the antimony coating and kept under vacuum is positioned in a high vacuum chamber 50 pumped to pressures below $2 \times 10^{-9}$ torr which is, or will become, that component of the lithography column containing the photoemissive cathode 16. The substrate 40 in the high vacuum chamber 50 is then heated to approximately 100° C. by the nichrome heater wire 58 wrapped around the periphery of the substrate 40. Also disposed within the vacuum chamber 50 is a cesium source "channel" 60 which contains, for example, a mixture of cesium chromate and a reducing agent such as silicon. The channel 60 is resistance-heated by means of an electrical connecting wire 62 to evaporate pure cesium onto the heated antimony film in the region 44. Evaporation of cesium onto the antimony film or chromium layer outside the region 44 will not affect the photoemissive behavior of the system. In this way a thin layer or film 48 of cesium antimonide is produced in the region 44. Overall thickness of the thin layer 48 may, for example, be about 400 angstroms. During the foregoing cesium evaporation process, the photoemissive cathode 16 is illuminated by, for example, the argon ion laser and the photon-generated current is measured by collecting the emitted electrons on the nichrome wire 52. When the photocurrent reaches a maximum value, the currents through the wire 62 and through the substrate-heating nichrome heater wire 58 are stopped so that no more cesium is deposited in the region 44. Should the photocurrent drop during cooling of the substrate, additional cesium is evaporated onto the cold surface 44. If the additional cesium evaporated onto the region 44 does not cause the photocurrent to return to its maximum value, more antimony may be evaporated onto the substrate followed by the deposition of additional cesium until a maximum value is attained.

Over a period of time, both with and without photoemission from its surface, the $Cs_3Sb$ cathode may degrade due to the loss of cesium and contamination by impurities. Such degradation can be reversed by additional evaporation of antimony and cesium onto the region 44 as detailed above.

In operation of the system, a laser beam from the laser 10 such as an argon ion laser, passes through the transparent substrate 40 and through the semitransparent chromium and nickel layer 46 and penetrates into the cesium antimonide layer 48, causing electrons to be emitted from the cesium antimonide. The electron beam thus emitted from the photoemissive cathode 16 has a high current density—for example, current densities in excess of 3 amperes per square centimeter have been achieved utilizing photoemissive films of cesium antimonide having an area of $4.8 \times 10^{-5}$ square centimeters and operated as substantially a point source—i.e., with an argon ion laser beam focussed on this very small area on the film. Higher values are considered achievable. Current densities in the beam at the plane of the target 21 will be several hundred amperes per square centimeter. Values in this range are well suited for direct-write lithography systems in which the electron beam is steered to generate a complex pattern on a semiconducting chip. In those systems, the beam is modulated at frequencies of at least several megahertz in order to write the many features comprising the pattern on a chip. Such electron beams may also be used in making masks for projection lithography or in non-lithographic applications such as electron beam microscopy.

Figure 5:
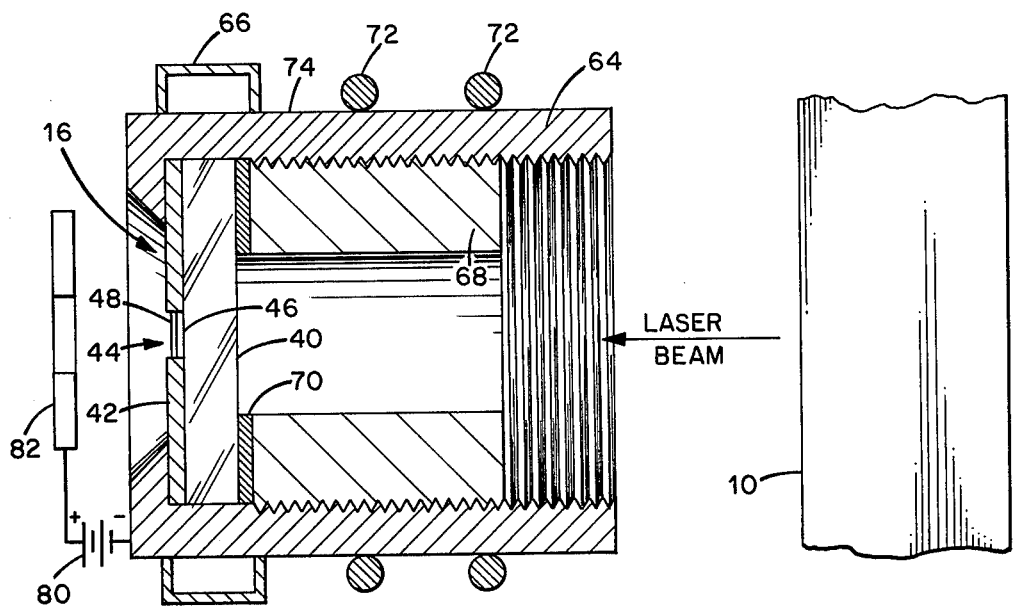
FIG. 5 is a cross-sectional side view of a photoemissive cathode of the invention which is equipped with a liquid cooler.

Because the photoemissive cathodes of the invention inherently operate as "cold" electron sources, for efficient, long life operation at high current density levels it is desirable that the electron beam generator systems disclosed herein be equipped with cooling devices to maintain the temperature of the photocathode near or below room temperature. For example, as illustrated in FIG. 5 (in which the same numbers are used to refer to parts previously identified), a photoemissive cathode 16 is enclosed in a housing 64 of conductive material such as stainless steel, and a cooler 66 is attached to the outside surface of the housing 64. The cooler 66 shown comprises a water-filled coil. However, any other suitable cooling device can be used. One preferred cooler is a thermoelectric cooler, a well known, electrically-powered device which offers the advantages of being compact, reliable, and not containing moving parts or fluid connections.

To verify certain aspects of the invention and particularly to measure the current density and useful life achievable by photoemissive cathodes constructed in accordance with the methods disclosed herein, a photoemissive cathode similar to that shown in FIG. 5 was tested in combination with an argon ion laser. The photocathode 16 included a sapphire disk 0.25 inches in diameter and 0.1 inch thick held within a stainless steel housing 64 by means of a nut 68 and a washer 70. The housing in turn was wrapped with a heating coil 72 and a liquid cooling tube 66 connected to a source of water, both the coil 72 and the tube 66 being brazed to the outside surface 74 of the housing 64. To form the remaining portions of the photocathode 16, nickel/chromium (Ni/Cr) was first evaporated from a nichrome wire in a vacuum chamber pumped to a pressure below about $10^{-6}$ torr with the substrate at 300° C. The Ni/Cr was deposited in an annular coating 42 about 2000 angstroms thick over the front surface of the substrate 40 except for a central region 44 of about 2 millimeters diameter, which was masked so as to be kept clear. Thereafter (also in vacuum) a thin layer of Ni/Cr about 100 angstroms thick was deposited in the central region 44, and this was followed by vapor depositions of antimony and cesium in the region 44 to produce a photoemissive layer 48 about 400 angstroms thick. The various depositions were performed at the appropriate temperatures described previously.

In tests of the above-described photocathode 16, a D.C. power source 80 was electrically connected to the stainless steel housing 64 to provide a flow of electrons to the annular coating 42 and in turn to the thin Ni/Cr layer and the photoemissive layer 48 in the central region 44. The positive terminal of the power source 80 was connected to a collector anode 82 spaced approximately 0.1 inches from the front surface of the sapphire substrate 40. To produce high current density emission of electrons, the photocathode 16 was back-illuminated by a continuous, unmodulated beam from an argon ion laser operated for test periods totaling up to about 100 hours.

Test runs were made at several laser power settings and illuminating wavelengths, various collector potentials, and at various photocathode temperatures and sizes of the central area. Only an indirect indication of photocathode temperatures was available during the tests since temperatures recorded were those (generally lower) values of the housing.

Figure 6:
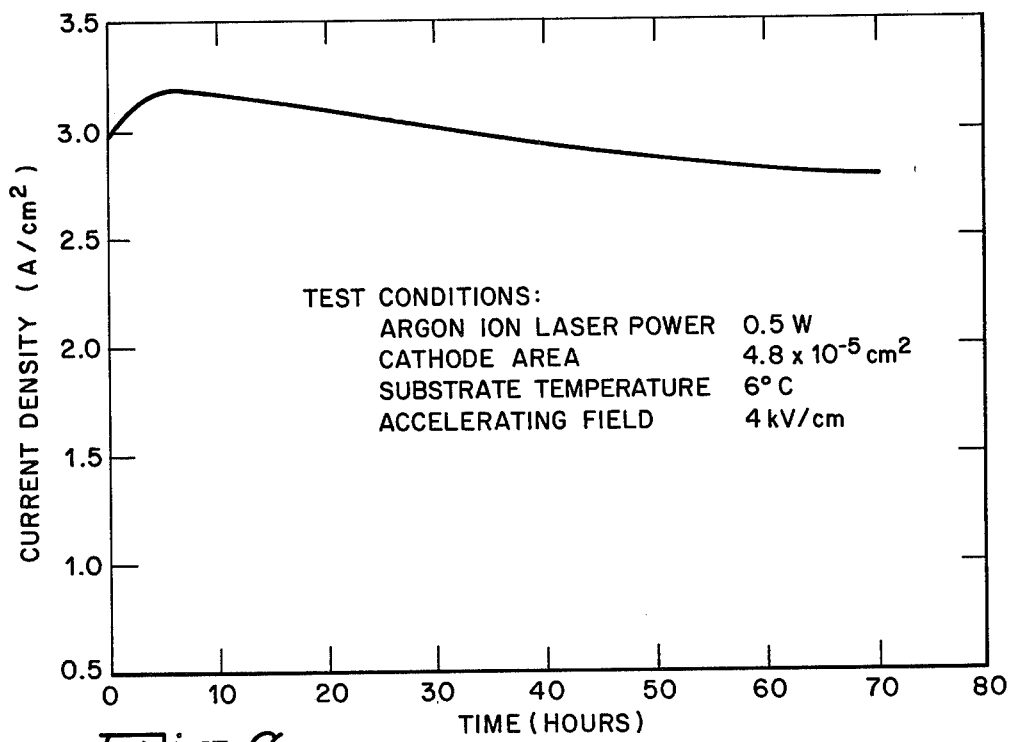
FIG. 6 is a graph illustrating the current densities achieved in tests of a photoemissive cathode of the invention as a function of time.

Results of three test runs are summarized in Table 1 below and current densities measured in Run No. 3 are plotted versus time in FIG. 6. The data show that current densities as high as 3.0 amps/cm² were achieved and that these current density levels degraded less than 15 percent over a test period of 70 hours.

TABLE 1

| Run No. | Laser Wavelength (Angstroms) | Laser Power (Watts) | Collector Potential (Volts) | Housing Temperature (°C.) | Peak Current Density (Amps/Cm²) |
|---|---|---|---|---|---|
| 1 | 4765 | 0.2 | 100 | 48 | .02 |
| 2 | 4765 | 0.3 | 150 | 20 | .03 |
| 3 | 4880 | 0.5 | 1000 | 6 | 3.0 |

Figure 7:
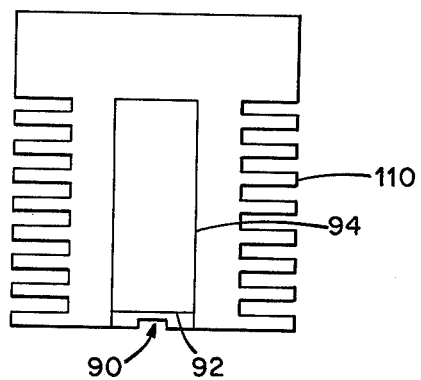
FIGS. 7 and 8 are schematic representations of portions of electron beam generators illustrating alternate embodiments of the invention.
Figure 8:
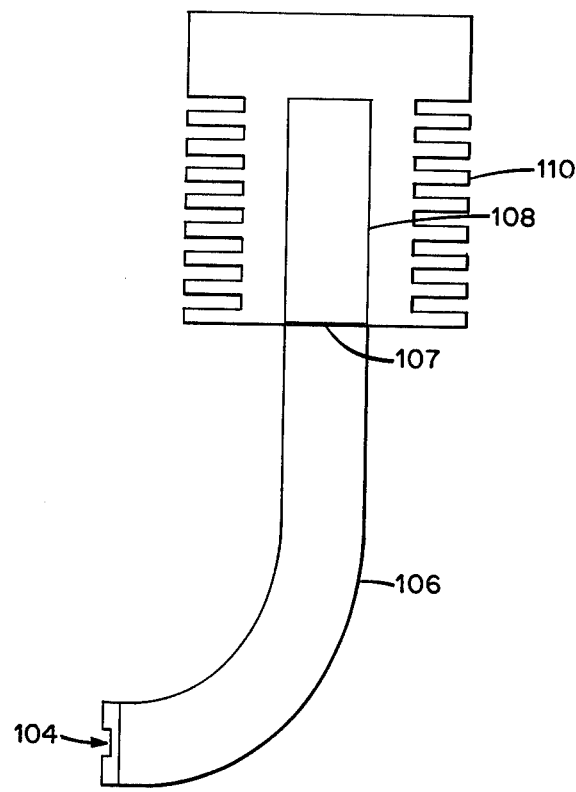

FIGS. 7 and 8 are schematic representations of portions of alternate embodiments of portions of an electron beam generator particularly adapted for use with an injection laser. The photoemissive cathode 90 of the system of FIG. 7, instead of being separated from its associated injection laser 94 by a light optical train (such as the optical train 12 shown in FIG. 2), is formed on the output facet 92 of an injection laser 94. A cooling device such as a finned thermoelectric cooler 110 may be provided to cool both the laser 94 and the photoemissive cathode 90.

The photoemissive cathode 104 shown in FIG. 8 is coated onto one end of an optical fiber 106 of material suitable for low-loss transmission of the beam of a laser. A suitable fiber is Telecommunication fiber Model MG 05, available from Valtec of West Boylston, Mass. The opposite end of the fiber 106 is connected to the output facet 107 of an injection laser 108 to receive its output beam. The injection laser 108 may be positioned inside a cooling device such as a thermoelectric cooler 110.

For the configurations illustrated in FIGS. 7 and 8, no optical train is needed to focus the laser beam onto the photoemissive cathodes 90 and 104. Also, since the cathode 90 and its associated laser 94 are in close proximity in the embodiment shown in FIG. 7, a single cooling device such as a thermoelectric cooler may be employed to cool both its cathode and laser.

It is thus seen that the objects of this invention have been achieved in that there has been disclosed a photoemissive cathode 16 which, when back-illuminated through a chromium and nickel layer with 50 to 60% optical loss, has a quantum efficiency of 3% or more and which upon degradation may be easily restored in situ by the deposition of additional cesium or cesium and antimony. The photoemissive cathode 16 is capable of generating a high current density of up to three amperes per square centimeter or greater to provide current densities at a target 21 of hundreds of amperes per square centimeter. In addition, there is a low energy spread among the electrons in the range of a few tenths or less of an electron volt. This small spread is a direct consequence of the low energy of the emitted photoelectrons. The maximum energy of the emitted electrons is dependent on the difference of the laser's photon energy and the electron emission threshold energy, defined by an electronic transition between the top of the photoemissive material's valence band and its vacuum level. For argon ion laser light of 514.5 nanometers (2.43 electron volts) and a threshold of photoemission of $Cs_3Sb$ of approximately 2.0 electron volts, the maximum emission energy of the electrons is 0.43 electron volts, which is, therefore, the maximum energy spread of the electrons. The nominal energy spread, commonly based on the half-width of the distribution curve of numbers of emitted electrons versus their energy is substantially lower than this.

The cathode operates at a low temperature such as room temperature so that there are no support problems as would be the case with a heated cathode. Furthermore, no heating-up time is required because the electrons are generated instantaneously in response to illumination by the laser light. Modulation of the electron beam can conveniently be accomplished by modulating the laser beam outside the vacuum chamber 18. In addition, beam shaping or patterning into complex shapes is easily accomplished by apertures or masks in the optical train between the laser 10 and the photoemissive cathode 16 outside of the vacuum enclosure 18.

It is to be understood that variations and modifications of the photoemissive cathode in combination with a modulated laser optical source and of the methods of fabricating the photoemissive cathodes disclosed herein will be evident to those skilled in the art. In the fabrication of photocathodes, for example, instead of masking the central region of a substrate during deposition of the thick conductive coating, the thick coating may be deposited over the entire region, then the thin conducting layer and photoemissive layer in the central region may be produced by photolithography and subsequent etching of the thick conductive layer in the central region, followed by vapor deposition first of the thin conductive layer and then the photoemissive layer. It is intended that all such modifications and variations be included within the scope of the appended claims.

What is claimed is:

1. An electron beam generator comprising:
   a continuous wave (CW) laser;
   a modulator for varying the intensity of, or deflecting, the optical output beam of said laser at modulation rates of at least several megahertz;
   a photoemissive cathode positioned for illumination by the output beam of said laser, said cathode including a substrate optically transmissive to said laser light, said substrate having a back side facing in a direction to receive an optical output beam of said laser and a front side opposite said back side, an electrically conductive film deposited on a selected region of the front side of said substrate, said film optically semitransparent to said laser light, a film of photoemissive substance selected from the group consisting of cesium antimonide, sodium potassium antimonide, cesiated gallium phosphide, cesiated gallium arsenide phosphide, and cesiated and oxygenated gallium arsenide, said film being deposited on said electrically conductive, optically semitransparent film and operable to emit a high current density, rapidly modulable beam of electrons upon illumination by said laser; and a thick, electrically conductive, metallic coating adjacent to said selected region and in electrical and thermal contact with said electrically conductive, optically semitransparent film; and
   a light optical train positioned between said laser and said cathode and operable to produce with the output beam of said laser a pattern of laser light on said photoemissive cathode such that said film emits a high current density, rapidly modulable beam of electrons to form an electron image determined by said pattern and which is suitable for directwrite semiconductor lithography.

2. An electron beam generator as in claim 1 wherein said light optical train includes at least one optical lens to focus the outbeam beam of said laser onto said film.

3. An electron beam generator as in claim 2 wherein said optical lens is operable to focus the output beam of said laser onto said film in a manner to form substantially a point source of electrons.

4. An electron beam generator as in claim 1 wherein said laser is an argon ion laser operable at a wavelength between 454.5 and 514.5 nanometers.

5. An electron beam generator as in claim 1 including a vacuum chamber, said photoemissive cathode being positioned within said chamber, and said laser, said modulator, and said light optical train being positioned outside said chamber.

6. An electron beam generator as in claim 1 further including means for cooling said photoemissive cathode.

7. An electron beam generator as in claim 1 wherein said thick, electrically conductive, metallic coating surrounds said selected region.

8. An electron source for generating substantially monochromatic, modulable, shapable, high intensity electron beams upon laser light illumination comprising:
   a substrate optically transmissive to said laser light;
   an electrically conductive film deposited upon a selected region of said substrate, said film optically semitransparent to said laser light;
   a film of photoemissive substance deposited on said conductive film, said photoemissive substance selected from the group consisting of cesium antimonide, sodium potassium antimonide, cesiated gallium phosphide, cesiated gallium arsenide phosphide, cesiated and oxygenated gallium arsenide, said film of photoemissive substance operable to emit a high current density beam of electrons upon illumination by laser light; and
   a thick, electrically conductive, metallic coating adjacent to said selected region and in electrical and thermal contact with said electrically conductive, optically semitransparent film to form therewith a low-resistance path for conducting electrons to, and heat away from, said semitransparent film of photoemissive substance.

9. An electron source as in claim 8 wherein said substrate is formed of a material selected from the group consisting of quartz and sapphire.

10. An electron source as in claim 9 further including means for cooling said thick, electrically conductive, metallic coating and said films.

11. An electron source as in claim 8 wherein said electrically conductive, optically semitransparent film is selected from the group consisting of chromium, aluminum, nickel, tungsten and mixtures thereof.

12. A method of fabricating a photoemissive cathode for high current density electron emission comprising in the order given the steps of:
providing a transparent substrate;
masking a portion of a selected side of said substrate;
depositing a thick metallic coating upon all of said side of said substrate except said masked portion to create a low-resistance electrical path;
unmasking said portion of the substrate;
depositing an electrically conductive film over at least said portion of the substrate, said film optically semitransparent to light of predetermined wavelengths;
depositing a layer of antimony over said electrically conductive film, and
evaporating onto said antimony layer a material selected from the group consisting of cesium, and sodium and potassium in a specified ratio.

13. A method of fabricating a photoemissive cathode as in claim 12 further incuding, during said deposition of cesium or sodium and potassium, illuminating said partially-fabricated cathode with a laser beam, measuring the current generated by said partially-fabricated cathode, and terminating said deposition of cesium or sodium and potassium when said current reaches a maximum value.

14. In a direct-write electron beam semiconductor lithography system, an improved electron beam generator comprising:
a continuous wave (CW) injection laser operable to produce an output beam of radiation in the near infrared portion of the spectrum;
means for modulating the current input to said injection laser at a modulation rate of at least several megahertz thereby to modulate the output beam of said laser; and
a photoemissive cathode positioned for illumination by the output beam of said laser, said cathode including a film of gallium arsenide coated with cesium and oxygen, said film operable to emit a high current density beam of electrons upon illumination by said laser.

15. An electron beam generator as in claim 14 wherein said photoemissive cathode is formed on an output facet of said injection laser.

16. An electron beam generator as in claim 14 including an optical fiber suitable for low-loss transmission of the output beam of said laser, said fiber having an input end connected to said laser to receive its output beam, and having an output end on which said photoemissive cathode is formed.

17. An electron beam generator as in claim 14 including means for cooling said photoemissive cathode.

18. In a direct-write electron beam semiconductor lithography system, an improved electron beam generator comprising:
a continuous wave (CW) light-emitting diode operable to produce an output beam of radiation in the near infrared portion of the spectrum;
means for modulating the current input to said light-emitting diode at a modulation rate of at least several magahertz thereby to modulate the output beam of said light-emitting diode; and
a photoemissive cathode positioned for illumination by the output beam of said light-emitting diode, said cathode including a film of gallium arsenide coated with cesium and oxygen, said film operable to emit a high current density beam of electrons upon illumination by said light-emitting diode.

19. An electron beam generator as in claim 18 wherein said photoemissive cathode is formed on an output facet of said light-emitting diode.

20. An electron beam generator as in claim 18 including means for cooling said photoemissive cathode.

21. In a direct-write electron beam semiconductor lithography system, an improved electron beam generator comprising:
a continuous wave laser;
a modulator for modulating the optical output beam of said laser at a rate of at least several megahertz;
a photoemissive cathode positioned for illumination by the output beam of said laser, said cathode including a substrate optically transmissive to said laser light, said substrate having a back side facing in a direction to receive an optical output beam of said laser and a front side opposite said back side, an electrically conductive film deposited on a selected region of the front side of said substrate, said film optically semitransparent to said laser light, a film of photoemissive substance selected from the group consisting of cesium antimonide, sodium potassium antimonide, cesiated gallium phosphide, cesiated gallium arsenide phosphide, and cesiated and oxygenated gallium arsenide, said film being deposited on said electrically conductive, optically semitransparent film and operable to emit a high current density, rapidly modulable beam of electrons upon illumination by said laser, and a thick, electrically conductive, metallic coating adjacent to said selected region and in electrical and thermal contact with said electrically conductive, optically semitransparent film; and
a light optical train positioned between said laser and said cathode and operable to produce with the output beam of said laser a pattern of laser light on said photoemissive cathode such that said film emits a high current density, rapidly modulable beam of electrons to form an electron image determined by said pattern and which is suitable for direct-write semiconductor lithography.

22. An electron beam generator as in claim 21 including means for cooling said photoemissive cathode.

* * * * *